United States Patent [19]
Covey et al.

[11] Patent Number: 5,428,550
[45] Date of Patent: Jun. 27, 1995

[54] HIERARCHICAL HARDWARE FLOWCHART USING SYMBOLIC MACROS

[75] Inventors: Donald K. Covey, Santa Clara; Sandra G. Schneider, San Jose, both of Calif.

[73] Assignee: National Semiconductor Corporation, Santa Clara, Calif.

[21] Appl. No.: 893,434

[22] Filed: Jun. 4, 1992

Related U.S. Application Data

[63] Continuation-in-part of Ser. No. 546,376, Jun. 28, 1990, Pat. No. 5,258,919.

[51] Int. Cl.⁶ .............................................. G06F 15/60
[52] U.S. Cl. ..................................... 364/489; 364/488
[58] Field of Search ............... 364/488, 489, 490, 491, 364/578

[56] References Cited

U.S. PATENT DOCUMENTS

| | | | |
|---|---|---|---|
| 4,792,909 | 12/1988 | Serlet | 364/491 |
| 4,922,432 | 5/1990 | Kobayashi et al. | 364/490 |
| 4,967,367 | 10/1990 | Piednoir | 364/489 |
| 5,005,136 | 4/1991 | Van Berkel et al. | 364/490 |
| 5,034,899 | 7/1991 | Schult | 364/488 |
| 5,164,911 | 11/1992 | Juran et al. | 364/578 |

OTHER PUBLICATIONS

"A Hierarchical Hardware Description Language" by M. Miyata et al., Electronic Design Automation-84, 26-30 Mar. 1984, pp. 189-193.

"A Concept for the Computer Hardware Description on the Register Transfer Level" by K. Kuchcinski, European Conf. on Electronic Design Automation-84, 26-30 Mar. 1984, pp. 194-198.

*Primary Examiner*—Vincent N. Trans
*Attorney, Agent, or Firm*—Limbach & Limbach; Vincenzo D. Pitruzzella

[57] ABSTRACT

A hierarchial hardware flowchart methodology for design of integrated circuits utilizes repetitious symbols in a first level flowchart with a single macro flowchart symbol per instance that conveys the same information, resulting in a two-dimensional flowchart. This allows the same information to be conveyed in a smaller, more readable format.

10 Claims, 15 Drawing Sheets

| ACCEPTABLE | NOT ACCEPTABLE | CIRCUITS | OUTPUT SIGNAL TYPES |
|---|---|---|---|
| 2L<br>1P | 2D<br>2S<br>2P<br>1L<br>1D<br>1S | 2a | 1L |
| 2L<br>1P | 2D<br>2S<br>2P<br>1L<br>1D<br>1S | 2b | 1D |
| 2L | 2D<br>2S<br>2P<br>1L<br>1D<br>1S<br>1P | | 1S |
| 2L | 2D<br>2S<br>2P<br>1L<br>1D<br>1S<br>1P | | 1P |
| 1L<br>1D | 2L<br>2D<br>2S<br>2P<br>1S<br>1P | | 1L |

FIG. 2A

| ACCEPTABLE | NOT ACCEPTABLE | CIRCUITS | OUTPUT SIGNAL TYPES |
|---|---|---|---|
| 1L<br>2P | 1D<br>1S<br>1P<br>2L<br>2D<br>2S |  | 2L |
| 1L<br>2P | 1D<br>1S<br>1P<br>2L<br>2D<br>2S | 1D  | 2D |
| 1L | 1D<br>1S<br>1P<br>2L<br>2D<br>2S<br>2P |  | 2S |
| 1L | 1D<br>1S<br>1P<br>2L<br>2D<br>2S<br>2P |  | 2P |
| 2L<br>2D | 1L<br>1D<br>1S<br>1P<br>2S<br>2P | 2j  | 2L |

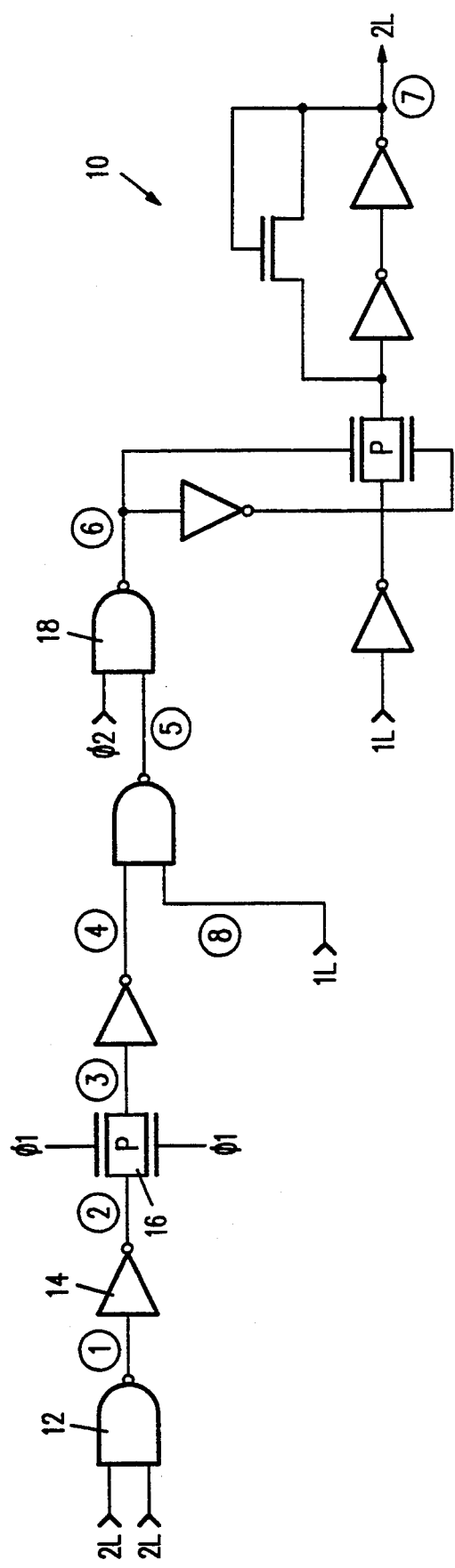
FIG. 4
FIG. 5D
FIG. 5C
FIG. 5B
FIG. 5A

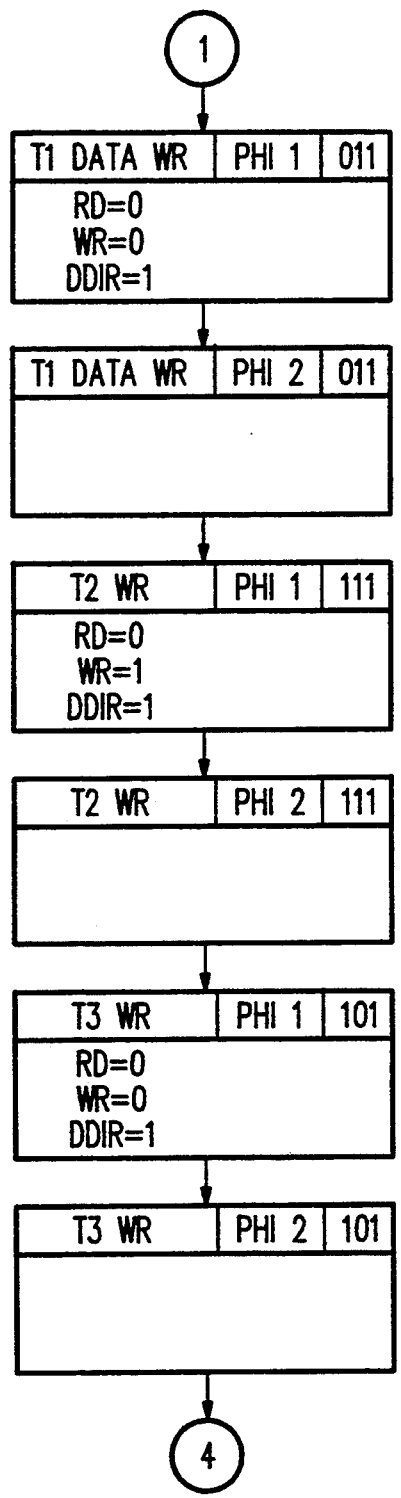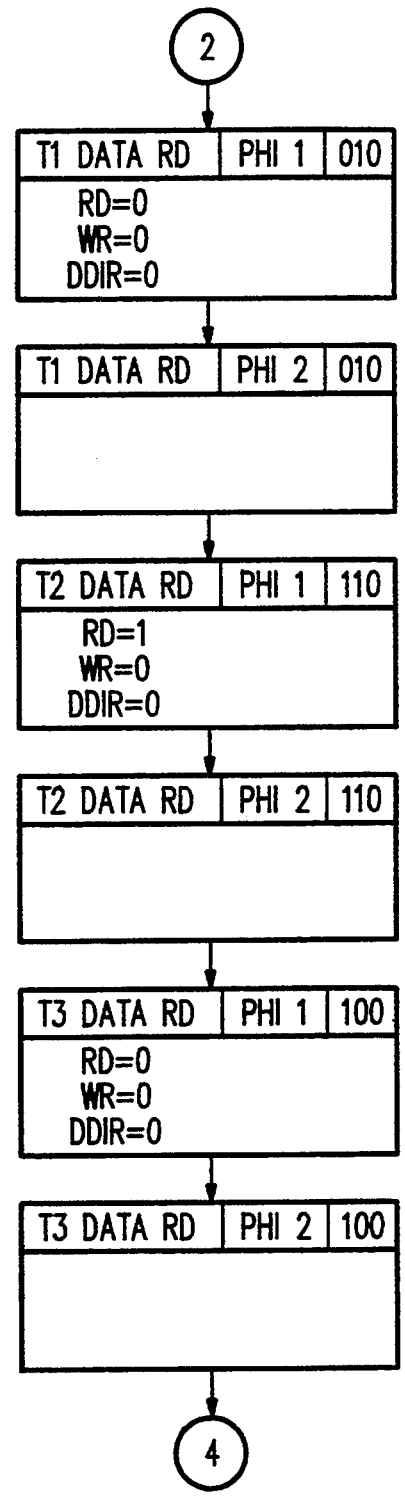
FIG. 8B                    FIG. 8C

VARIABLE a

| TY,A/B,C | 0 0 | 0 1 | 1 1 | 1 0 |
|---|---|---|---|---|
| 0 0 | 0 | x | 0 | 0 |
| 0 1 | 1 | 1 | 1 | 1 |
| 1 1 | 1 | 1 | 1 | 1 |
| 1 0 | 0 | 0 | 0 | 0 |

| TY,A/B,C | 0 0 | 0 1 | 1 1 | 1 0 |
|---|---|---|---|---|
| 0 0 | 0 | 0 |   | 0 |
| 0 1 | 1 | 1 | 1 | 1 |
| 1 1 | 1 | 1 | 1 | 1 |
| 1 0 | 0 | 0 | 0 | 0 | a = A

| TY,A/B,C | 0 0 | 0 1 | 1 1 | 1 0 |
|---|---|---|---|---|
| 0 0 | 0 | 0 | 0 | 0 |
| 0 1 | 1 | 1 | 1 | 1 |
| 1 1 | 1 | 1 | 1 | 1 |
| 1 0 | 0 | 0 | 0 | 0 |

| TY,A/B,C | 0 0 | 0 1 | 1 1 | 1 0 |
|---|---|---|---|---|
| 0 0 | 0 | 0 | 0 | 0 |
| 0 1 | 1 | 1 | 1 | 1 |
| 1 1 | 1 | 1 | 1 | 1 |
| 1 0 | 0 | 0 | 0 | 0 |

| TY,A/B,C | 0 0 | 0 1 | 1 1 | 1 0 |
|---|---|---|---|---|
| 0 0 |   |   |   |   |
| 0 1 |   |   |   |   |
| 1 1 |   |   |   |   |
| 1 0 |   |   |   |   |

| TY,A/B,C | 0 0 | 0 1 | 1 1 | 1 0 |
|---|---|---|---|---|
| 0 0 |   |   |   |   |
| 0 1 |   |   |   |   |
| 1 1 |   |   |   |   |
| 1 0 |   |   |   |   | b = B

| TY,A/B,C | 0 0 | 0 1 | 1 1 | 1 0 |
|---|---|---|---|---|
| 0 0 |   |   |   |   |
| 0 1 |   |   |   |   |
| 1 1 |   |   |   |   |
| 1 0 |   |   |   |   |

| TY,A/B,C | 0 0 | 0 1 | 1 1 | 1 0 |
|---|---|---|---|---|
| 0 0 |   |   |   |   |
| 0 1 |   |   |   |   |
| 1 1 |   |   |   |   |
| 1 0 |   |   |   |   | c = C

FIG. 9A

VAR A

| TY,A/B,C | 0 0 | 0 1 | 1 1 | 1 0 |
|---|---|---|---|---|
| 0 0 |  |  | 1 | 1 |
| 0 1 |  |  | 1 | 1 |
| 1 1 |  |  | 1 | 1 |
| 1 0 |  |  | 1 | 1 |

| TY,A/B,C | 0 0 | 0 1 | 1 1 | 1 0 |
|---|---|---|---|---|
| 0 0 |  |  | 1 | 1 |
| 0 1 |  |  | 1 | 1 |
| 1 1 |  |  | 1 | 1 |
| 1 0 |  |  | 1 | 1 |

A = b

| TY,A/B,C | 0 0 | 0 1 | 1 1 | 1 0 |
|---|---|---|---|---|
| 0 0 |  |  | 1 | 1 |
| 0 1 |  |  | 1 | 1 |
| 1 1 |  |  | 1 | 1 |
| 1 0 |  |  | 1 | 1 |

| TY,A/B,C | 0 0 | 0 1 | 1 1 | 1 0 |
|---|---|---|---|---|
| 0 0 |  |  | 1 | 1 |
| 0 1 |  |  | 1 | 1 |
| 1 1 |  |  | 1 | 1 |
| 1 0 |  |  | 1 | 1 |

VAR B

| TY,A/B,C | 0 0 | 0 1 | 1 1 | 1 0 |
|---|---|---|---|---|
| 0 0 | 0 |  | 1 | 1 |
| 0 1 |  |  |  |  |
| 1 1 |  |  |  |  |
| 1 0 | 0 |  | 1 | 1 |

| TY,A/B,C | 0 0 | 0 1 | 1 1 | 1 0 |
|---|---|---|---|---|
| 0 0 | 1 |  | 1 | 1 |
| 0 1 |  |  |  |  |
| 1 1 |  |  |  |  |
| 1 0 | 1 |  | 1 | 1 |

| TY,A/B,C | 0 0 | 0 1 | 1 1 | 1 0 |
|---|---|---|---|---|
| 0 0 | 1 |  | 1 | 1 |
| 0 1 |  |  |  |  |
| 1 1 |  |  |  |  |
| 1 0 | 1 |  | 1 | 1 |

| TY,A/B,C | 0 0 | 0 1 | 1 1 | 1 0 |
|---|---|---|---|---|
| 0 0 | 1 |  | 1 | 1 |
| 0 1 |  |  |  |  |
| 1 1 |  |  |  |  |
| 1 0 | 1 |  | 1 | 1 |

FIG. 9B

VAR C

| TY,A/B,C | 0 0 | 0 1 | 1 1 | 1 0 |
|---|---|---|---|---|
| 0 0 | | | 1 | |
| 0 1 | | | 1 | |
| 1 1 | | | 1 | |
| 1 0 | | | 1 | |

| TY,A/B,C | 0 0 | 0 1 | 1 1 | 1 0 |
|---|---|---|---|---|
| 0 0 | | | 1 | |
| 0 1 | | | 1 | |
| 1 1 | | | 1 | |
| 1 0 | | | 1 | |

| TY,A/B,C | 0 0 | 0 1 | 1 1 | 1 0 |
|---|---|---|---|---|
| 0 0 | | | 1 | |
| 0 1 | | | 1 | |
| 1 1 | | | 1 | |
| 1 0 | 1 | | 1 | |

| TY,A/B,C | 0 0 | 0 1 | 1 1 | 1 0 |
|---|---|---|---|---|
| 0 0 | | | 1 | |
| 0 1 | | | 1 | |
| 1 1 | | | 1 | |
| 1 0 | 1 | | 1 | |

VAR RD

| TY,A/B,C | 0 0 | 0 1 | 1 1 | 1 0 |
|---|---|---|---|---|
| 0 0 | | | 1 | |
| 0 1 | | 1 | 1 | |
| 1 1 | | | | |
| 1 0 | | | | |

| TY,A/B,C | 0 0 | 0 1 | 1 1 | 1 0 |
|---|---|---|---|---|
| 0 0 | | | | |
| 0 1 | | | | |
| 1 1 | | | | |
| 1 0 | | | | |

| TY,A/B,C | 0 0 | 0 1 | 1 1 | 1 0 |
|---|---|---|---|---|
| 0 0 | | | | |
| 0 1 | | | | |
| 1 1 | | | | |
| 1 0 | | | | |

| TY,A/B,C | 0 0 | 0 1 | 1 1 | 1 0 |
|---|---|---|---|---|
| 0 0 | | | | |
| 0 1 | | | | |
| 1 1 | | | | |
| 1 0 | | | | |

FIG. 9C

HIERARCHICAL HARDWARE FLOWCHART USING SYMBOLIC MACROS

RELATED APPLICATIONS

This is a Continuation-In-Part application of commonly-assigned U.S. patent application Ser. No. 546,376, filed on Jun. 28, 1990, by Yamanouchi et al., now U.S. Pat. No. 5,258,919 for STRUCTURED LOGIC DESIGN METHOD USING FIGURES OF MERIT AND A FLOWCHART METHODOLOGY. The aforementioned application is hereby incorporated by reference to provide additional background regarding the present invention.

TECHNICAL FIELD

The present invention relates generally to integrated circuit design and, in particular, to an integrated circuit design method that utilizes symbolic macros to provide a hierarchical behavioral description flowchart of a logic function.

BACKGROUND

The above-referenced Yamanouchi et al. U.S. application Ser. No. 546,376 discloses a structured integrated circuit design methodology with particular applicability to two-phase logic design. The methodology is based on describing a logic function using a high level behavioral description flowchart, properly sizing devices to be used in the circuit for speed, and reducing trial and error in circuit layout implementation using novel chip planning techniques.

The Yamanouchi et al. methodology begins with the definition of signal types based on both the circuit function that creates a particular signal and the type of input signal that feeds the circuit function. A set of rules is then established for use of the signal types. Next, the inputs and outputs of the logic function are defined and utilized to create a behavioral flowchart using defined symbols. An associated database is then created that defines the parameters of the various elements of the flowchart. The flowchart is then converted to a logic diagram, either by coded state assignment or by direct implementation. The resulting logic diagram is then analyzed for speed utilizing a Figures of Merit (FOM) technique for establishing device sizes. The resulting circuit design may then be carried through to layout utilizing conventional computer aided design (CAD) tools.

While the Yamanouchi et al. methodology provides a unique design technique that improves vastly on the prior art, it can result in a flowchart that includes repetitive information. This is particularly true for complex sequential processing circuits. This repetitive information consumes a large area on the flowchart and makes it difficult to read.

SUMMARY

The present invention improves on the Yamanouchi et al. methodology by replacing repetitious symbols in a single-level hardware flowchart with a single macro symbol per instance that conveys the same information. This allows the same information to be conveyed in a much smaller area.

A better understanding of the features and advantages of the present invention will be obtained by reference to the following detailed description of the invention and accompanying drawings which set forth an illustrative embodiment in which the principles of the invention are utilized.

DESCRIPTION OF THE DRAWINGS

FIG. 4 is a schematic diagram illustrating a circuit example of the use of the signal types defined in FIG. 2.

FIGS. 5A–5D illustrate symbols used in a hierarchical flowchart methodology in accordance with the present invention.

FIG. 9 provides logic equations associated with the FIG. 8 flowchart.

DETAILED DESCRIPTION

Most MOS VLSI circuits are implemented using two phase logic.

Figure 1:
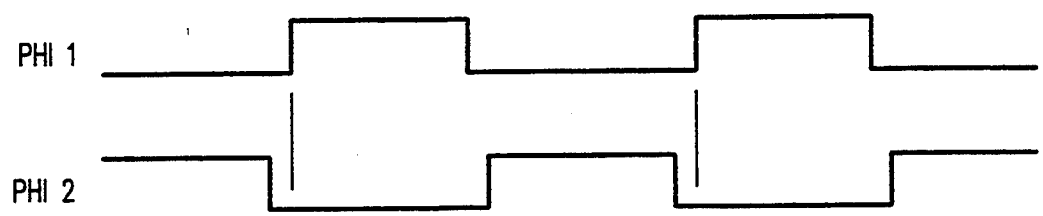
FIG. 1 is a timing diagram illustrating non-overlapping clock signals.

As shown in FIG. 1, signals PHI1 and PHI2 are non-overlapping clocks which can both be used individually as the clocking signal for memory elements and as a timing reference.

The immediately following discussion defines the characteristics of two-phase logic circuits and introduces a concept of identifying signals by defined signal types.

The definition of signal types is based upon both the circuit function that creates a particular signal and the type of input signal that feeds the circuit function.

The signal types provide labels which categorize a signal by its timing characteristics relative to the phase signals PHI1 and PHI2 and, as stated above, by the circuit function that generates it. The objective in defining signal types is to create a signal "language" that uniquely distinguishes the output of a circuit and qualifies the circuit inputs so that only proper inputs and outputs can be connected together.

FIG. 2 shows the defined output signal types, the circuits that generate these signal types, and the inputs acceptable to the circuits. For example, circuit 2a at the top of FIG. 2 generates an output of signal type 1L; the inputs acceptable to circuit 2a may be either a signal type 2L or a signal type 1P.

Figure 3:
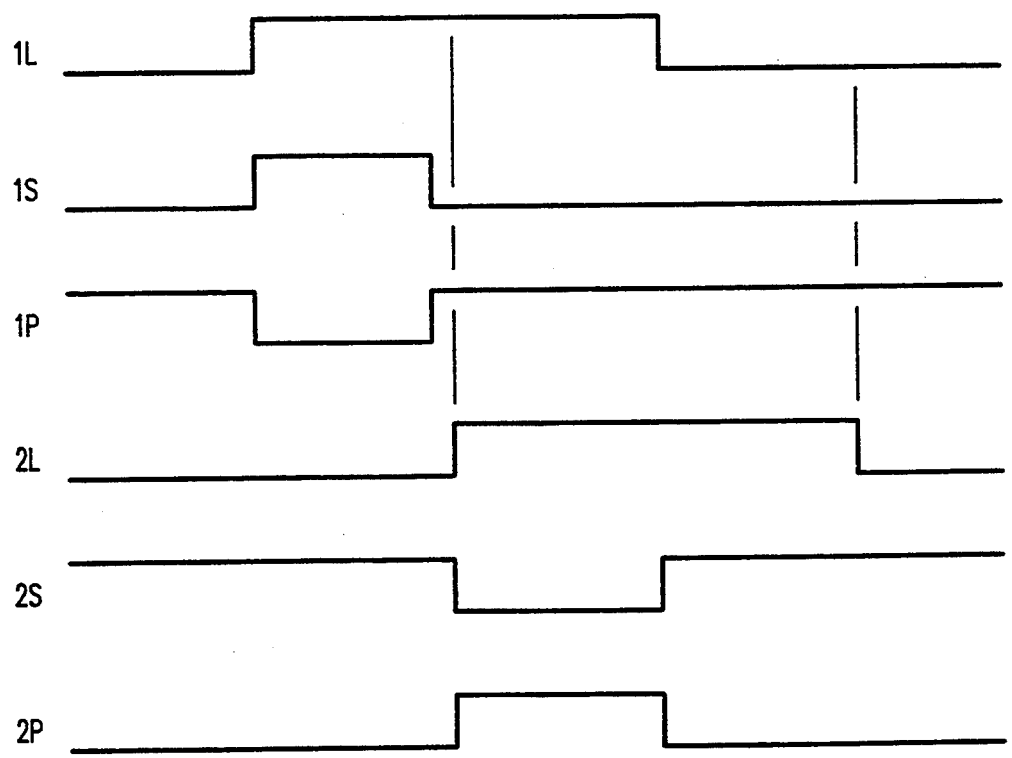
FIG. 3 is a timing diagram illustrating waveforms associated with the signal types defined in FIG. 2.
Figure 2B:
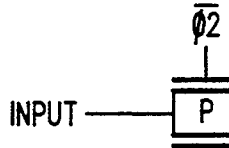
FIG. 2 is a table, including schematic representations, of signal type definitions utilizable in accordance with the present invention.
Figure 2B:
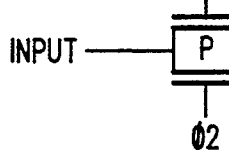
Figure 2B:
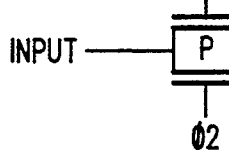
Figure 2B:
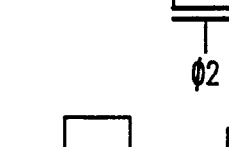
Figure 2B:
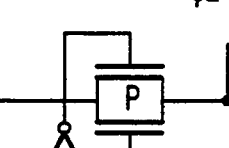

FIG. 3 shows the waveforms generated for the various signal types defined in FIG. 2.

An example of the use of the FIG. 2 signal type definitions is provided by the circuit 10 shown in FIG. 4. In circuit 10, node 1 is driven by a NAND gate 12 which is in turn driven by 2L input signals. Therefore, as indicated by box 2j in FIG. 2, node 1 is a 2L signal. Node 1 feeds an invertor 14, the output of which is node 2. Therefore, node 2 is also a 2L signal. Node 3 is the output of a transmission gate 16 which is driven by a PHI1 clock. The input to transmission gate 16 is node 2, a 2L signal. Therefore, as indicated by box 2b in FIG. 2, the node 3 output of the transmission device 16 is a 1D signal. By similar reference to the FIG. 2 signal type definitions, nodes 4 and 5 are 1L signals and node 6 is a 2S signal to produce node 7 as a 2L signal.

If, however, the node 8 input to circuit 10 is a 2L signal, rather than the illustrated 1L signal, then node 5 would be required to be a 2L signal, which feeds the strobing NAND gate 18 driven by the PHI2 clock. Thus, the output of NAND gate 18 becomes a 2S output signal. This result is inconsistent with the signal types defined in FIG. 2, which establishes that the circuit which generates a 2S signal must have a 1L signal as an input. Therefore, the FIG. 2 signal type definitions verify that a 2L signal type input at node 5 is not allowed.

Only five basic symbols are used in the first level of the flowchart technique: the state block, the decision rhombus, the output oval, the transition vector, and the continuation circle. FIGS. 5A-5D show the state block, decision rhombus, output oval and continuation circle symbols, respectively. The transition vector should be well known to those skilled in the art.

The state block, illustrated in FIG. 5A, represents a state of the machine and has the following characteristics:
1. The state lasts for one clock period.
2. The state must be a PHI1 or PHI2 state and labeled as such.
3. The state block is labeled with a unique state name.
4. The state variable assignments are given.
5. The output variables are assigned their value in the body of the state block.

The decision rhombus, illustrated in FIG. 1B, has the following characteristics:
1. This rhombus directs the selection of the next state for the following phase period.
2. The input variable is from a source external to the machine and is labeled within the rhombus.
3. Each input controls a binary selection.
4. The decision rhombus can be concatenated to achieve logical functions.

The output oval, illustrated in FIG. 5C, designates or contains output variables and has the following characteristics:
1. The output oval contains outputs which are dependent upon both the present state and input variable(s).
2. Both the state and input variable must be of the same signal type.
3. The input variable from another machine must not be from an output oval of that machine.

The continuation circle is shown in FIG. 5D, and is used as follows:
1. To join the transition vectors when the path is discontinuous at a page boundary.
2. To join transition vectors when there are too many outputs feeding a common point.
3. Merely as a convenience.

The transition vector is used to show the transition from state to state through the decision rhombus if it exists.

The most common application of flowcharting a logic implementation occurs when implementing a state machine which must perform a function to control transfer conditions of registers used in data paths.

Consider a situation wherein a machine must be created to arbitrate the transactions of an I/O bus on a CPU. The requirements will be as follows:
1. Two requestors of the bus will exist.
2. Requestor #1 will do reading and writing and have priority over Requestor #2 should there be a contention. Further, Requestor #1 will flag its request for service by setting active a line labeled REQ#1 and indicates its desire by setting active the line called TYPE if the request is write, or having TYPE be inactive if the request is read.
3. Requestor #2 only does reading and will request service by activating the REQ#2 line.
4. Outputs provided are, Read strobe (RD), Write strobe (WR) and Data direction (DDIR).

The easiest and recommended way to begin the process of flowcharting is to start with a simple (non-rigorous) model, then successively increase its complexity and rigidity to create a sound and implementable flowchart. Since, at this stage, the phase partitions are ambiguous, they should be disregarded and only the "ideas" should be implemented. As quickly as possible, a flowchart should be sketched to bring the ideas into focus.

Figure 6A:
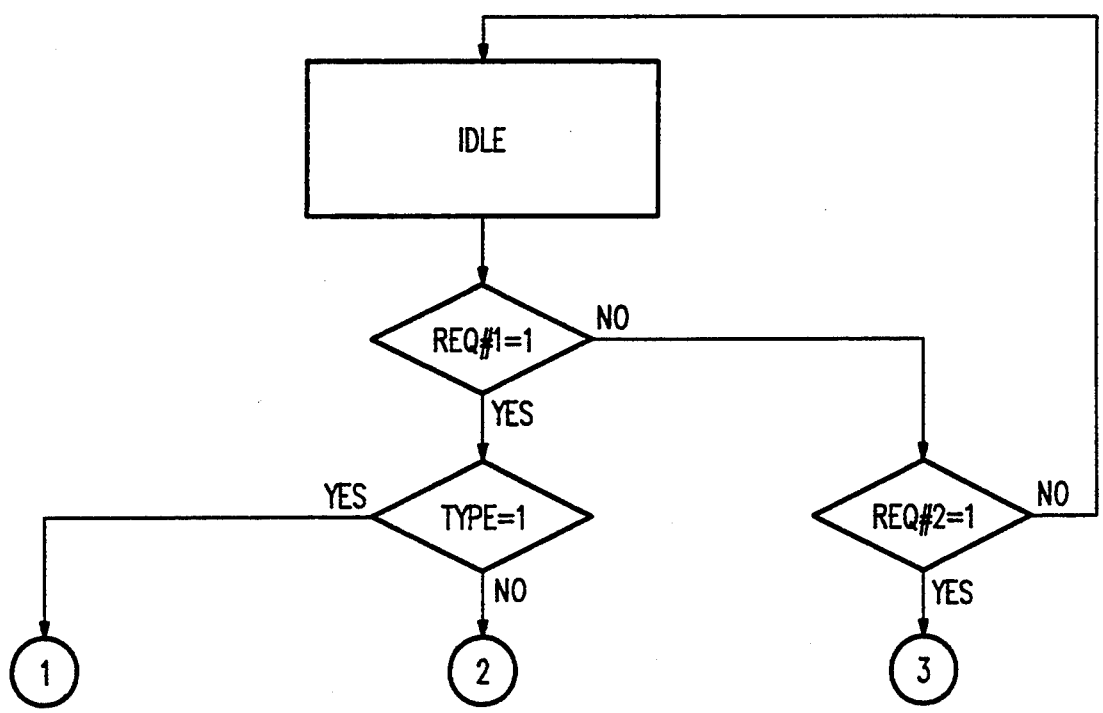
FIGS. 6A–6D provide a first iteration flowchart generated in accordance with a hierarchical flowchart methodology in accordance with the present invention.

Referring to FIG. 6A, start with a state block; call it Idle. From this block, draw an output vector to a decision rhombus for REQ#1. From this diamond, draw two output vectors labeling them YES and NO. Draw the NO vector to another decision rhombus for REQ#2 and provide two more vector outputs from this rhombus labeling them YES and NO. From the NO vector of REQ#2, create a vector that goes back to the Idle block. Draw the YES vector of REQ#1 to a decision rhombus TYPE=1. From the TYPE=1 rhombus, provide two vectors and label them YES and NO. Draw the YES vector of the TYPE=1 rhombus to a continuation circle and label it 1. Draw the NO vector to a continuation circle and label it 2. Draw the YES vector of the REQ#2 rhombus to a continuation circle and label it 3.

Figure 6B:
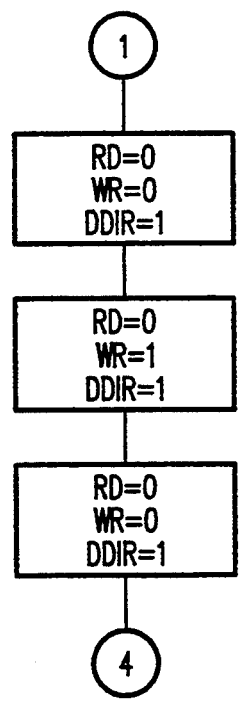

FIG. 6B constitutes the write cycle for data. The three outputs described earlier must be considered to create a proper data transfer. Note that all of the details (such as address output, data being selected, etc.) are omitted from the chart for the sake of simplifying the example, but the essence of clarification by organization still retains its merit with the three selected outputs. Starting with the number 1 continuation circle, the vector goes directly to the first block of transfer where the direction of the bus is set. However, the WR is "given time" before being sent active in the next block. The third block inactivates WR, but holds DDIR to give it a hold time. It is important to note that the exact time or number of cycles which are allowed for the set-up and hold for the WR are not specified now, as a convenient latitude which may be useful later.

Figure 6C:
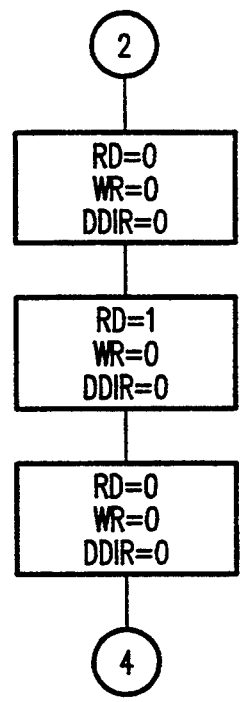
Figure 6D:
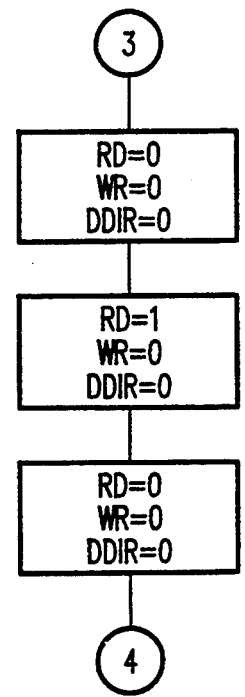

FIG. 6C shows the data read cycle with the same level of consideration as that for data write. FIG. 6D shows the instruction read cycle.

Both the data read cycle and instruction read cycle are identical and could be combined. However, they are left separated at this stage since detailed timing considerations have not yet been inserted. The signal which would intuitively be a function of this machine, the destination selection signal of instruction or data, has not been specified. Considerations such as this should be questioned and checked for accuracy, but these considerations are often predetermined at a higher level in the machine architecture.

The flowchart of FIG. 6A-6D is already descriptive enough to raise many questions. These questions and their answers should be documented such that the next iteration of the flowchart will be as accurate as possible. Again, however, this effort should not take so much time that it becomes a project in itself. Instead, the task of creating a more rigorous flowchart should answer many of the questions (and also create new questions). This will funnel more information to the designer in a shorter period of time, and thereby make the designer more productive.

The next step is to create a detailed flowchart which incorporates:

1. The timing in terms of the PHI1 and PHI2 clocks.
2. All inputs with proper signal types.
3. All outputs with proper signal types.

Figure 7A:
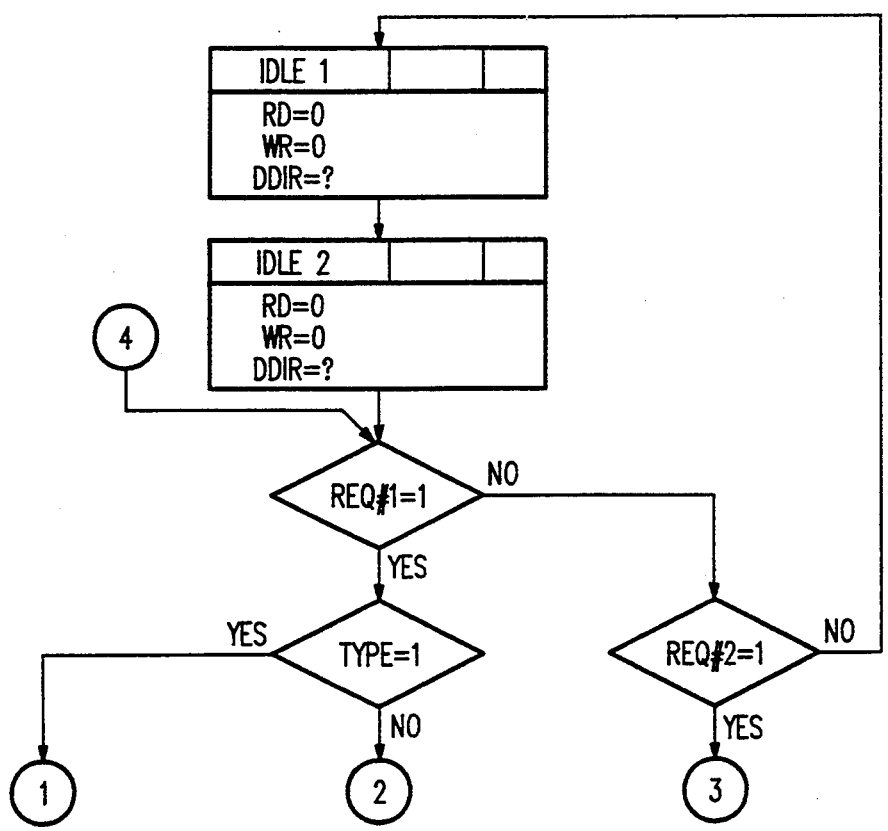
FIG. 7 provides a more detailed version of the FIG. 6A–6D flowchart.
Figures 7B, 7C, 7D:
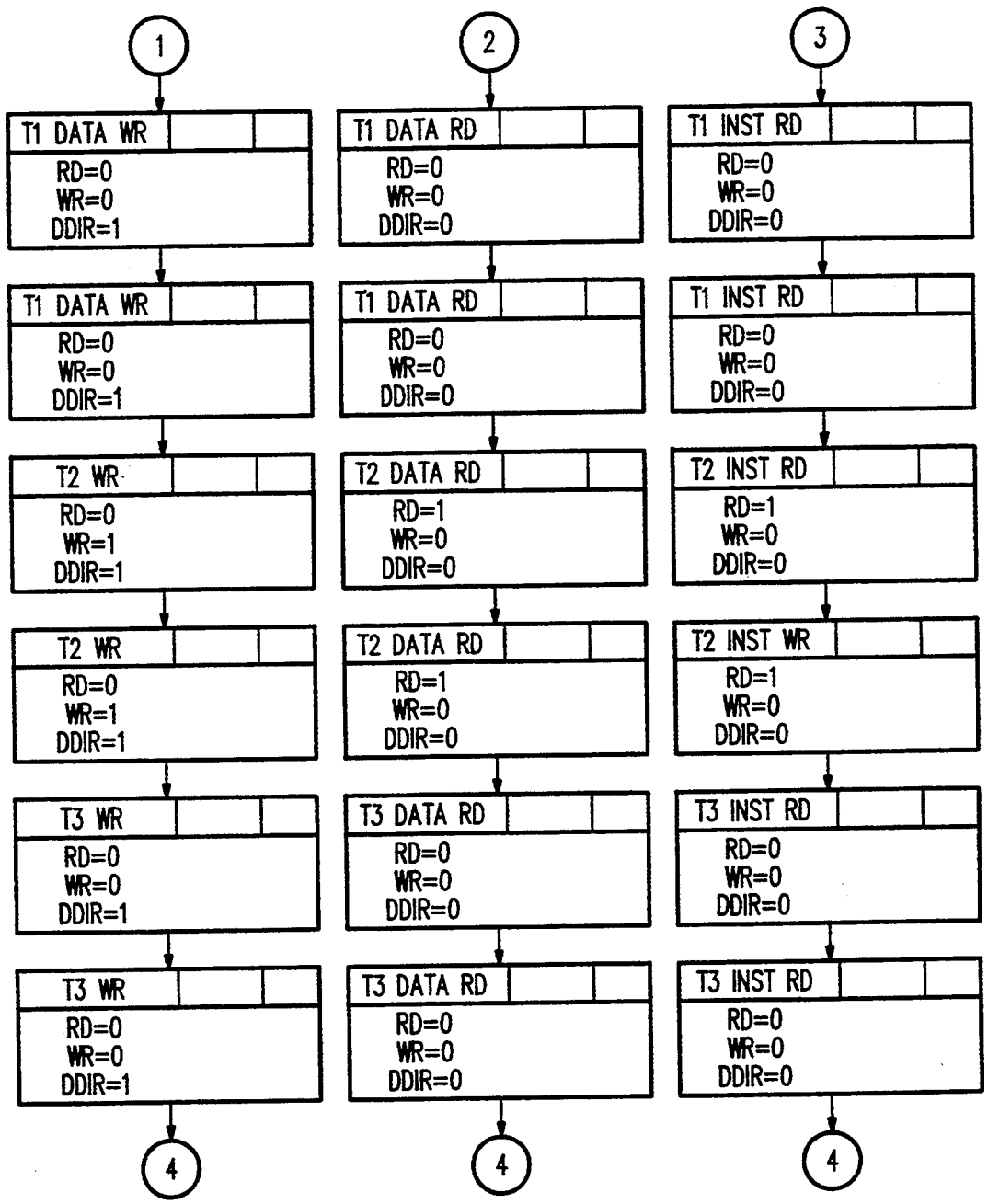

FIG. 7 illustrates the same machine as that shown in FIGS. 6A-6D, however in detailed form. As can be seen, the FIG. 7 implementation of the flowchart is much more rigorous, including the state names for each block, assigning the phase to each block, accounting for all of the outputs in each block, and being careful to see that each vector terminates at some state, as demonstrated by the addition of continuation circle 4 vectoring to the REQ#1 decision rhombus.

As this is done, many questions arise. Why are two states needed for each function? Won't this technique be too rigid for more complex functions? Some states look redundant, can they be deleted? Is a block diagram necessary to be able to relate to the real world? These and many other questions must be answered to make this a sound procedure. However, in an effort to keep this example on track, the discussion will progress by showing how this machine can be reduced to hardware.

To begin the implementation into hardware, the states forming the data read sequence will first be combined with the sequence forming the instruction read sequence. The two streams are indistinguishable, since they produce the same outputs as well as go to the same next state under similar conditions. This process is state reduction done intuitively. The result now alters the flow such that the sequence between continuation circles 3 and 4 is eliminated, and the vector from the REQ#2, YES now goes to continuation circle 2. This reduced flow now contains 14 states. However, the implementation can be accomplished with 3 bits of memory because there are two phases. For instance, one state in PHI1 time can have an assignment of 101; also, one in PHI2 time can have an assignment of 101.

Next, phases are assigned to the state blocks. Although done at random in this example, this can be a crucial step in most applications for the consideration of timing with inputs and outputs. This means that the signal type rules defined above must be followed.

Figure 8A:
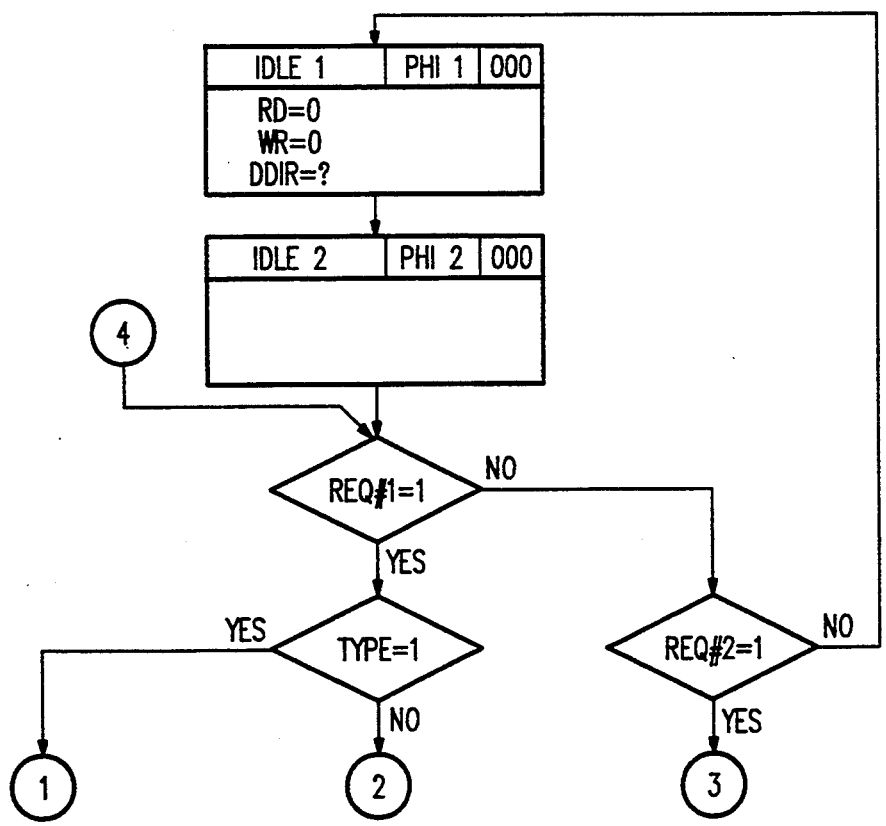
FIG. 8 provides a completed flowchart based on the FIG. 6A–6D and FIG. 7 versions.

The state assignments are done with some intuitive concern, such that the outputs will not need too much decoding. With this done, the flowchart now appears as shown in FIG. 8. This flowchart is now in its completed form.

The state transition and output table can now be created and is shown in Table 1 at the end of this detailed description. Note that two tables are created to show the PHI1 present state to PHI2 next state and PHI2 present state to PHI1 next state.

Using conventional techniques, the transition and output tables reduce to the equations shown in FIG. 9. The corresponding logic implementation is then shown in FIG. 10.

Figure 10:
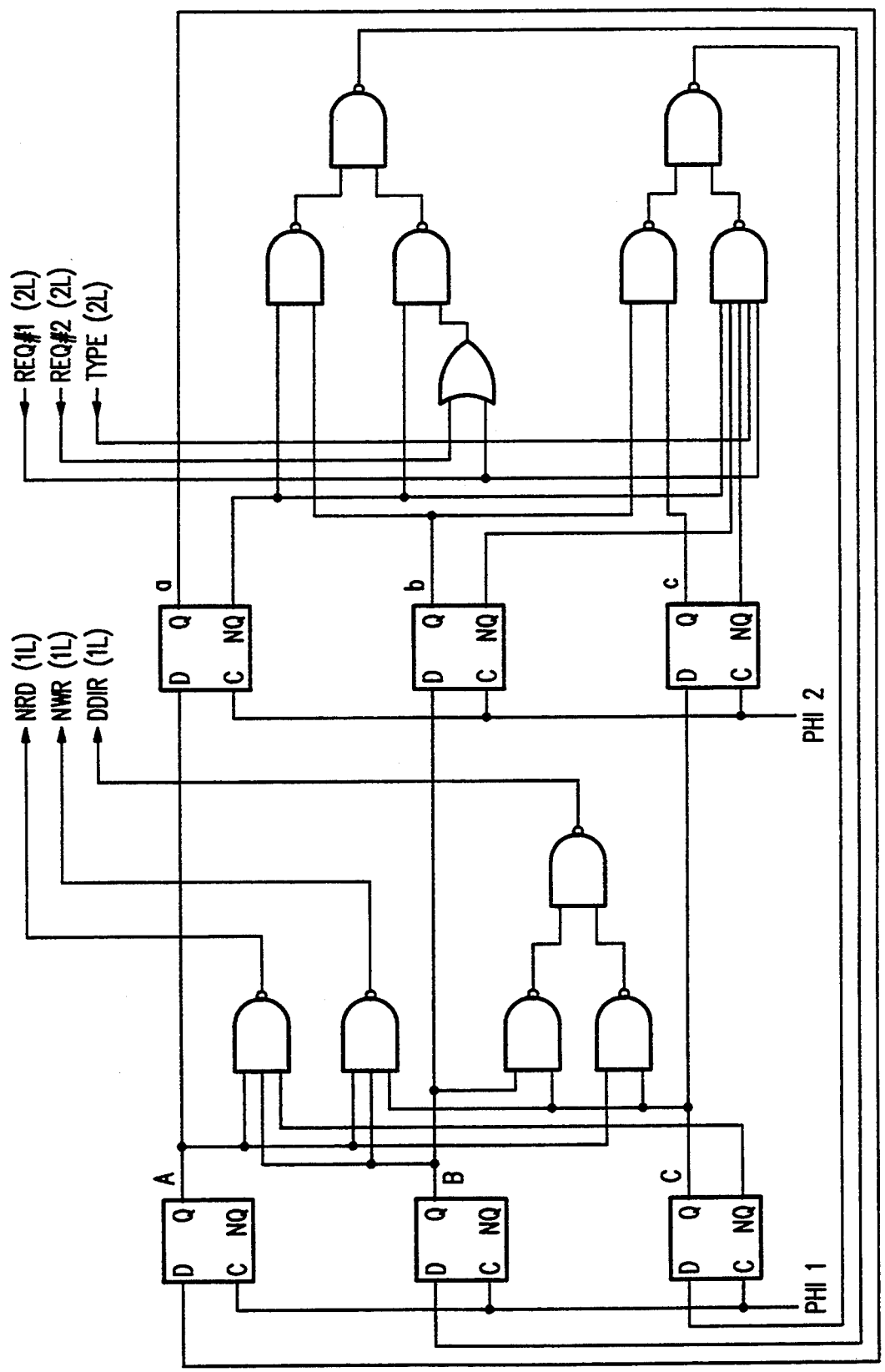
FIG. 10 is a logic diagram resulting from the FIG. 8 flowchart based on the FIG. 9 equations.

With the logic implemented, the signal types are now labeled as shown in FIG. 10. Notice that the signal types are all consistent with the rules defined above. This will be true because, with this technique, one is able to "see through" the flowchart to take care of the signal types. With practice, or insight, even the circuit speeds can be "seen through" the flowchart. All this can be related back to sound principles of information theory and statistical data, and not gut feel. With the signal types checked, the methodology of the present invention has progressed to the point where FOM techniques, described in detail in the above-referenced related application, will now serve the designer well in assigning device sizes. While the FIG. 8 flow chart serves as the basis for explaining the principals of developing a single level flowchart, those skilled in the art will appreciate that logic functions being developed today for implementation in integrated circuit form are usually much more complex than the example developed above. Utilization of the methodology described in designing such complex logic functions can lead to flowcharts that consume considerable area. In some cases, a large area of these complex logic flowcharts is taken up by repetitive information.

Figure 11:
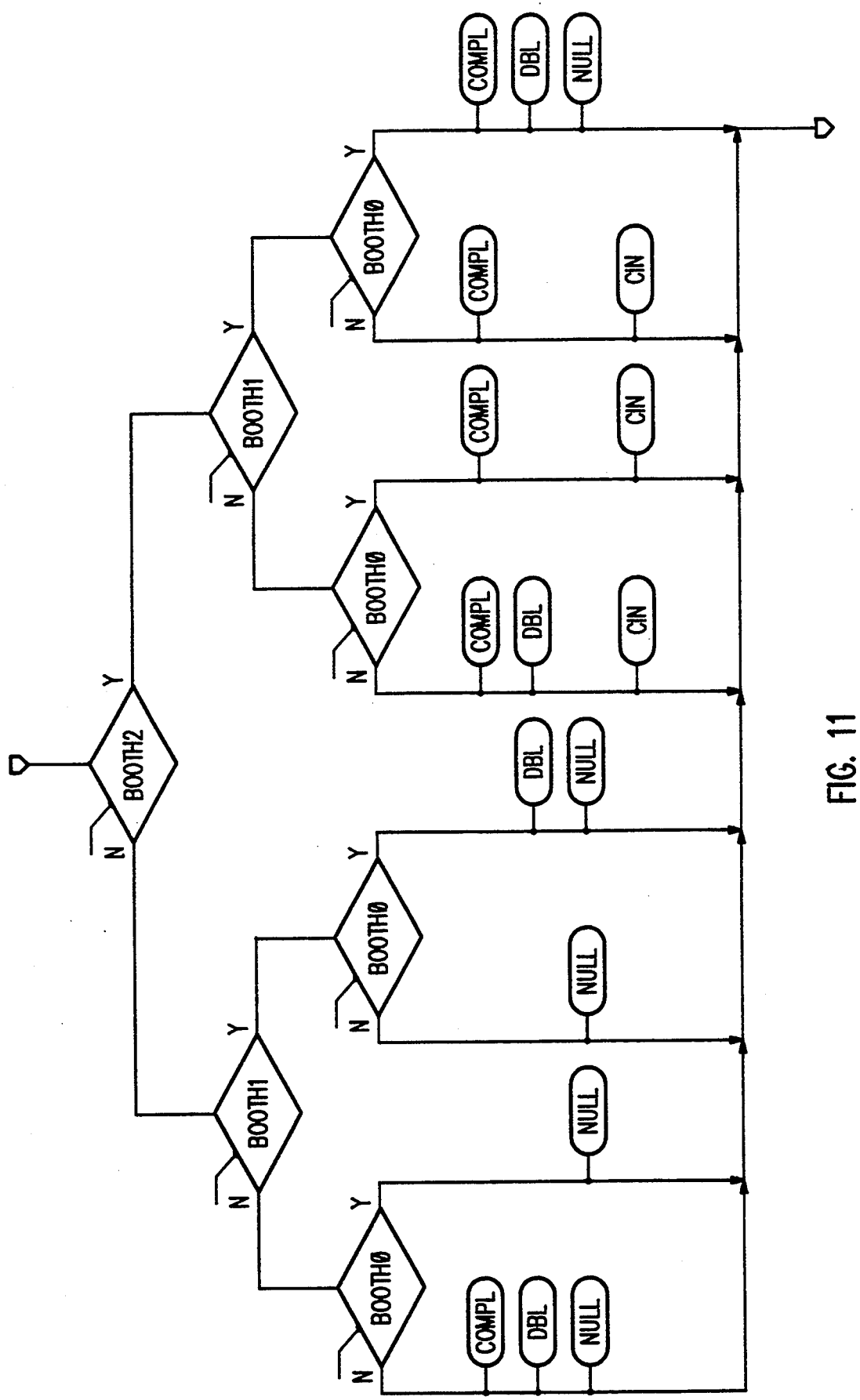
FIG. 11 provides a portion of a hierarchical flowchart that illustrates the occurrence of a repetitious element in the overall flowchart.

For example, bitslice processors include parallel data processing paths that incorporate identical logic network segments. FIG. 11 shows a possible flowchart representation of one such logic network segment generated utilizing the single-level flowchart methodology described above. The overall flowchart for the bitslice processor would require that the FIG. 11 flowchart representation be repeated for each bitslice of the processor.

Figure 12:
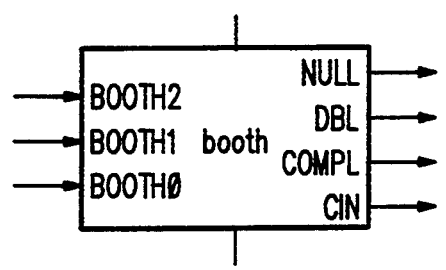
FIG. 12 provides a macro flowchart symbol representative of the FIG. 11 repetitious element.
Figure 13:
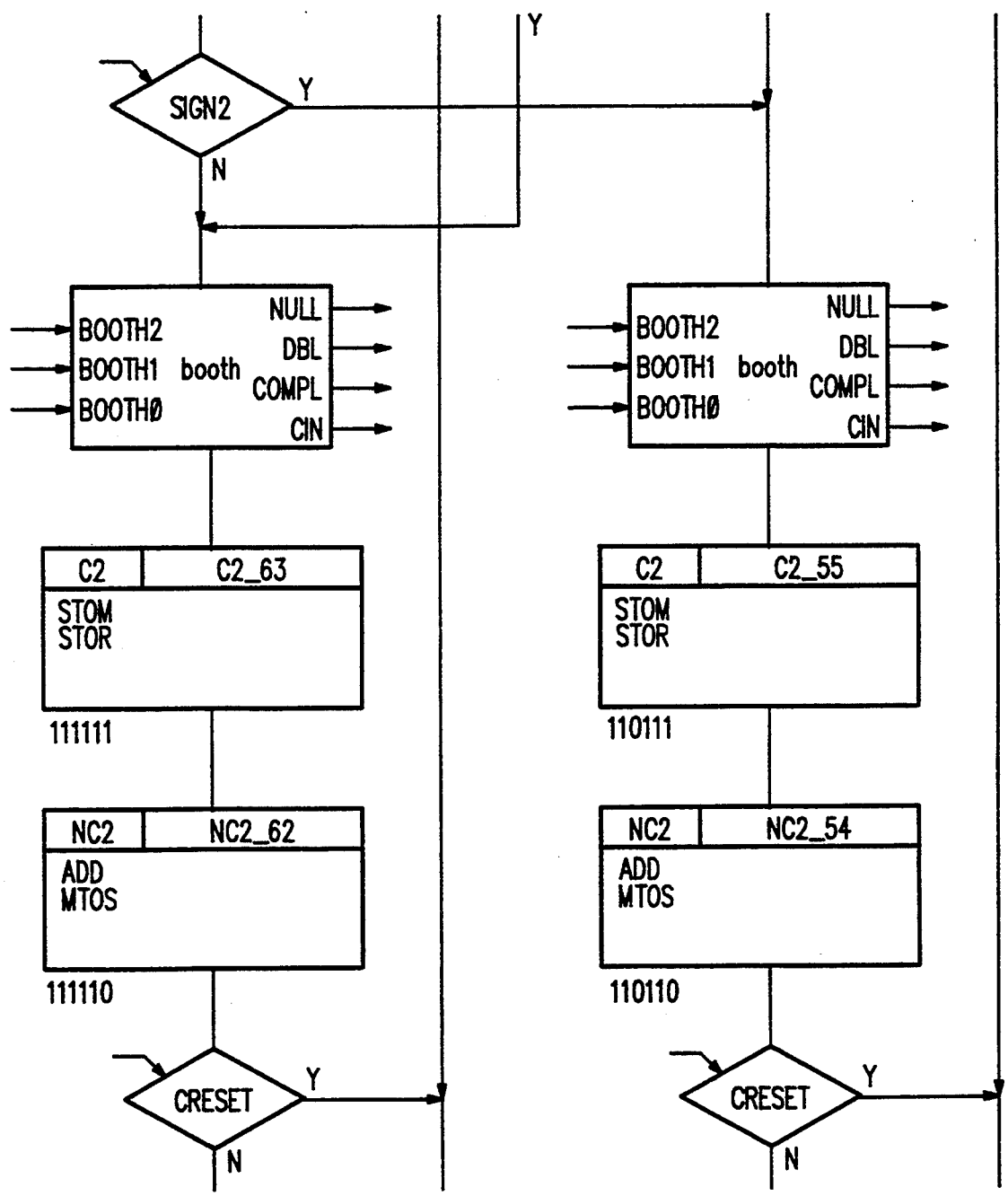
FIG. 13 illustrates utilization of the FIG. 12 macro flowchart symbol in a hierarchical flowchart in accordance with the present invention.

In accordance with the present invention, such repetitive segments of the flowchart are replaced by a single hierarchical symbol. For example, the FIG. 11 flowchart representation of a bitslice logic network segment can be replaced by the macro flowchart symbol shown in FIG. 12. A portion of the overall bitslice processor flowchart, now utilizing the macro flowchart symbol in a hierarchial format, is shown in FIG. 13.

Utilization of macro flowchart symbols as described above allows much more information regarding the logic function to be described in a smaller, more readable format. The person reading the flowchart can recognize the macro symbol in each instance and understand the action hidden from view by utilizing a singular scratchpad reference. Conventional logic synthesis tools can be utilized to correctly expand each macro to provide a flattened set of boolean equations prior to logic synthesis.

Figure 14:
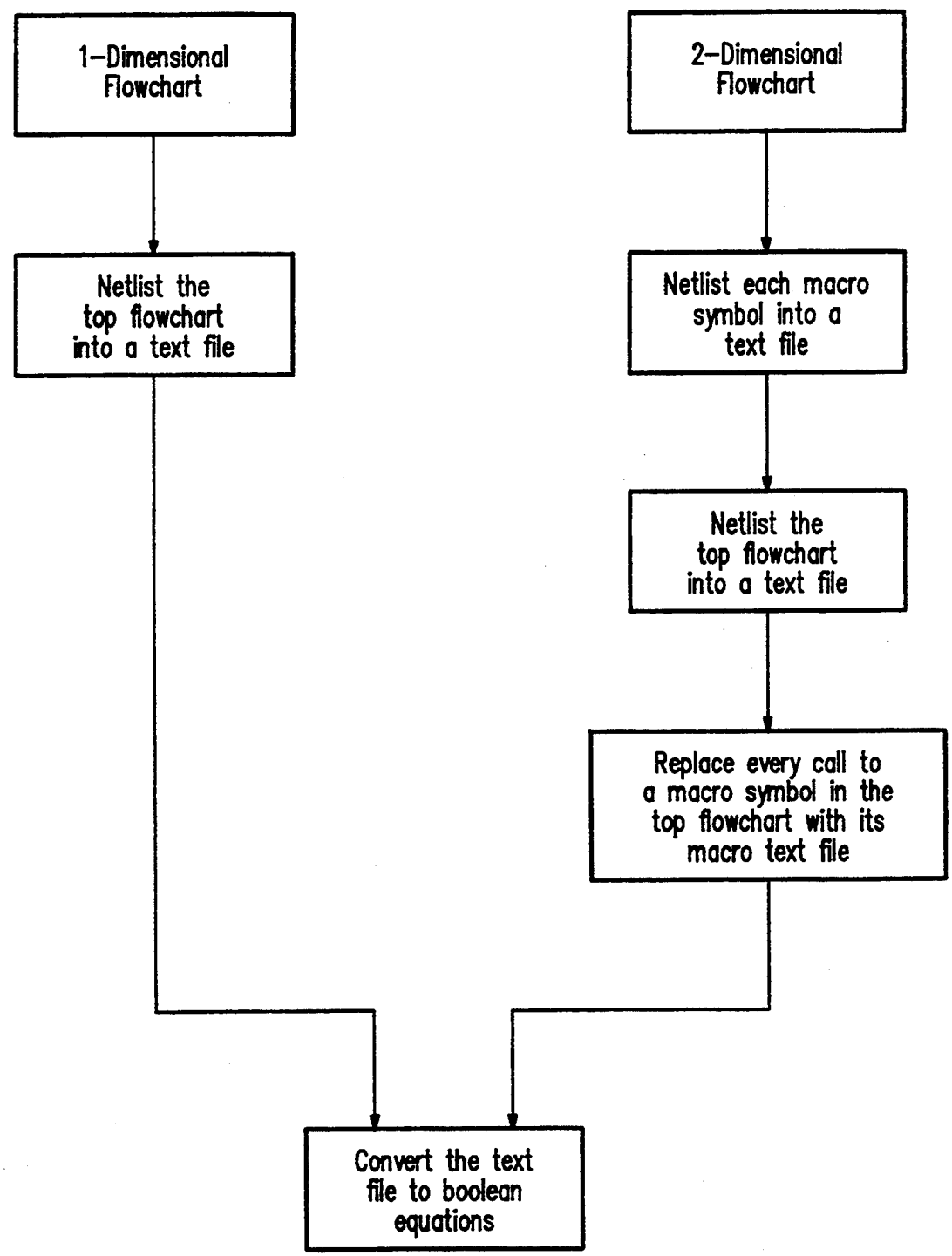
FIG. 14 is a flowchart illustrating conversion of a hierarchical flowchart to a boolean equations in accordance with the present invention.

More specifically, the procedure for converting a two-dimensional hierarchical flowchart as described above to boolean equations is as follows. With reference to FIG. 14, first, as indicated above, to convert a one-dimensional flowchart to boolean equations, the graphical flowchart is converted to a text file netlist listing every flowchart element and its connections. As shown in FIG. 14, to expand a two-dimensional flowchart to boolean equations involves expanding each macro symbol into a macro text file netlist, expanding the first-level flowchart into a text file netlist, and then replacing every call to a macro symbol in the first-level text file netlist with the corresponding macro text file netlist to provide a flattened netlist. The flattened net list is then converted to boolean equations. Thus, the macro symbols are interpreted in the netlist phase, not in the conversion to boolean equations. Finally, the boolean equations are utilized to generate a corresponding logic diagram.

It should be understood that various alternatives to the embodiment of the invention described herein may be employed in practicing the invention. It is intended that the following claims define the scope of the invention and that methods within the scope of these claims and their equivalents be covered thereby.

What is claimed is:

1. A digital computer implemented method of creating a hierarchical flowchart of a logic function, the method comprising:
   (a) defining a plurality of individual first-level flowchart symbols such that each individual first-level flowchart symbol represents a subelement logic function;
   (b) defining at least one macro flowchart symbol such that said at least one macro flowchart symbol represents a defined combination of two or more of said individual first-level flowchart symbols; and
   (c) generating a behavioral flowchart of the logic function utilizing interconnected individual first-level flowchart symbols and said at least one macro flowchart symbol.

2. A method as in claim 1 and including the further step of converting the behavioral flowchart into a corresponding text file netlist.

3. A method as in claim 2 and including the further step of converting the text file netlist into corresponding boolean equations.

4. A method as in claim 3 and including the further step of converting the boolean equations into a corresponding logic diagram.

5. A method as in claim 1 and including the further steps of:
   (a) converting said at least one macro flowchart symbol into a corresponding macro text file netlist;
   (b) converting the behavioral flowchart into a corresponding first-level text file netlist wherein every call to said at least one macro flowchart symbol is replaced in the first-level text file netlist by the macro text file netlist whereby a flattened netlist is generated.

6. A method as in claim 5 and including the further step of converting the flattened netlist to corresponding boolean equations.

7. A method as in claim 6 and including the further step of converting the boolean equations into a corresponding logic diagram.

8. A digital computer implemented method of creating a flowchart of a logic function, the method comprising the steps of:
   (a) generating and storing in memory data defining a plurality of signal types based on the particular circuit function that generates a corresponding output signal and the signal types that serve as inputs to said particular circuit function;
   (b) generating and storing in memory data defining a set of rules for utilizing the signal types;
   (c) defining a plurality of individual first-level flowchart symbols such that each individual first-level flowchart symbol represents a subelement logic function;
   (d) defining at least one macro flowchart symbol such that said at least one macro flowchart symbol represents a defined combination of two or more of said individual first-level flowchart symbols; and
   (e) generating a behavioral flowchart of the logic function utilizing interconnected individual first-level flowchart symbols and said at least one macro flowchart symbol.

9. A method as in claim 8 and including the further step of converting the behavioral flowchart into a corresponding text file netlist.

10. A method as in claim 9 and including the further step of converting the text file netlist into corresponding boolean equations.

* * * * *